United States Patent
Park et al.

(10) Patent No.: US 10,627,567 B2
(45) Date of Patent: Apr. 21, 2020

(54) LIQUID CRYSTAL DISPLAY DEVICE AND LED ASSEMBLY

(71) Applicant: LG Display Co., Ltd., Seoul (KR)

(72) Inventors: Jae-Hyun Park, Paju-si (KR); Sang-Hyun Lee, Paju-si (KR); Chi-Yong Kim, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 11 days.

(21) Appl. No.: 15/789,114

(22) Filed: Oct. 20, 2017

(65) Prior Publication Data

US 2018/0113248 A1 Apr. 26, 2018

(30) Foreign Application Priority Data

Oct. 20, 2016 (KR) .................. 10-2016-0136231

(51) Int. Cl.
*F21V 8/00* (2006.01)
*H01L 25/13* (2006.01)
*H01L 33/48* (2010.01)
*H01L 33/54* (2010.01)

(52) U.S. Cl.
CPC .......... *G02B 6/009* (2013.01); *G02B 6/0068* (2013.01); *G02B 6/0073* (2013.01); *G02B 6/0083* (2013.01); *H01L 25/13* (2013.01); *G02B 6/0086* (2013.01); *H01L 33/483* (2013.01); *H01L 33/54* (2013.01)

(58) Field of Classification Search
None
See application file for complete search history.

(56) References Cited

U.S. PATENT DOCUMENTS

| | | | | |
|---|---|---|---|---|
| 2007/0253218 A1* | 11/2007 | Tanabe | .................. | G02B 6/0068 362/612 |
| 2008/0121898 A1* | 5/2008 | Yin | ...................... | G02B 6/0068 257/88 |
| 2010/0067256 A1* | 3/2010 | Chang | .................. | G02B 6/0068 362/615 |
| 2011/0080754 A1* | 4/2011 | Wang | .................... | G02B 6/0068 362/613 |

(Continued)

FOREIGN PATENT DOCUMENTS

| | | |
|---|---|---|
| EP | 2 442 179 A1 | 4/2012 |
| TW | 201113603 A1 | 4/2011 |
| WO | 2006/027883 A1 | 3/2006 |

*Primary Examiner* — Ryan Crockett
(74) *Attorney, Agent, or Firm* — Seed IP Law Group LLP

(57) ABSTRACT

A liquid crystal display device includes a liquid crystal panel and a light guide plate below the liquid crystal panel. The liquid crystal display device also includes first and second LED packages that are arranged alternately along a light entering surface of the light guide plate. Additionally, the liquid crystal display device includes a printed circuit board that has first and second portions facing each other and at which the first and second LED packages are mounted, respectively. The printed circuit board also includes a third portion, in a bent state, which connects an end of the first portion in a lengthwise direction, and an end of the second portion in a lengthwise direction. The liquid crystal display device further includes a first guide portion that is located at an outer side of the first and second LED packages. The first guide portion is interposed between and attached to the first and second portions.

23 Claims, 5 Drawing Sheets

(56) References Cited

U.S. PATENT DOCUMENTS

| | | | |
|---|---|---|---|
| 2012/0243258 A1* | 9/2012 | Park | F21V 21/00 362/612 |
| 2012/0293730 A1* | 11/2012 | Ueyama | G02B 6/0068 348/790 |
| 2014/0368769 A1* | 12/2014 | Lee | G02B 6/0068 349/65 |
| 2017/0098636 A1* | 4/2017 | Miyamoto | H01L 25/167 |
| 2017/0200870 A1* | 7/2017 | Chen | H01L 33/507 |
| 2018/0212129 A1* | 7/2018 | Saito | H01L 23/3677 |

\* cited by examiner

LIQUID CRYSTAL DISPLAY DEVICE AND LED ASSEMBLY

CROSS REFERENCE TO RELATED APPLICATIONS

The present application claims the priority benefit of Korean Patent Application No. 10-2016-0136231 filed in Republic of Korea on Oct. 20, 2016, which is hereby incorporated by reference in its entirety.

BACKGROUND

Technical Field

The present disclosure relates to a liquid crystal display device (LCD), and particularly, relates to an LCD which can reduce a limitation on a pitch of light emitting diode (LED) packages mounted on a printed circuit board (PCB).

Description of the Related Art

As our society continues to becomes more information-based, the need for various types of display devices continues to increase. Recently, flat display devices, such as a liquid crystal display device (LCD), a plasma display panel device (PDP), and an organic light emitting diode (OLED) display device, have been used by consumers.

Among these display devices, LCDs are widely used because they have desirable properties such as being lightweight, having a thin profile, having a low power consumption, and the like.

A recently employed light source for the LCD is a light emitting diode (LED).

FIG. 1 is a schematic view illustrating an LED assembly for an LED according to the prior art.

Referring to FIG. 1, the LED assembly 20 includes a printed circuit board (PCB) 22 and LED packages 21 spaced apart from each other and mounted on the PCB 22.

The LED package 21 is usually mounted on the PCB 21 using a surface mounting technology (SMT). A surface of the PCB 21 is covered by a coverlay film made of an insulating material, and the coverlay film is formed to expose an electrode pad, of the PCB 22, contacting the LED package 21.

However, in manufacturing the prior art LED assembly 20, due to manufacturing tolerances or the like, there is a limitation that a separation distance d between the LED packages 21 cannot be reduced to less than a certain distance. Accordingly, there is a limitation on a pitch that is an arrangement interval of the LED packages 21.

For example, a mounting tolerance in the SMT is about 100 um with respect to one side of each LED package 21, and an attaching tolerance of the coverlay film is about 100 um with respect to one side of each LED package 21. Further, an insulation width, which is a width of a portion of the coverlay film located between the neighboring LED packages 21, is required to be about 200 um. Accordingly, the separation distance d is required to be at least 600 um that is [(mounting tolerance*2)+(attaching tolerance*2)+insulating width]=[100 um*2+100 un*2+200 um].

As such, the prior art requires the separation distance d of 600 um or greater, and thus a limitation on a pitch of the LED packages 21 happens.

Accordingly, there is a limitation on a number of the LED packages 21 mounted on the PCB 22. Therefore, an optical distance, which is a distance from a light entering surface of a light guide plate to a display region, cannot be reduced, and a realization of a narrow bezel is very difficult to achieve.

As such, there is a continuing need in the art for a method of mounting LCD components that does not have these limitations.

BRIEF SUMMARY

Accordingly, the present disclosure is directed to an LCD and an LED assembly. The disclosed method substantially obviates one or more of the technological problems due to limitations of the related art.

One or more embodiments of the present disclosure provide an LCD and an LED assembly that can improve a limitation on a pitch of an LED packages mounted on a printed circuit board (PCB).

Additional features and embodiments of the disclosure will be set forth in the description which follows, and in part will be apparent from the description. These and other technological improvements of the disclosure will be realized and attained by the structure particularly pointed out in the written description and claims hereof as well as the appended drawings.

In accordance with the present disclosure, as embodied and broadly described herein, a liquid crystal display device includes a liquid crystal panel and a light guide plate below the liquid crystal panel. Additionally, the liquid crystal display device includes first and second LED packages that are arranged alternately along a light entering surface of the light guide plate. The liquid crystal display device also includes a PCB that has first and second portions which face each other and which the first and second LED packages are mounted at, respectively, and a third portion, in a bent state, which connects an end, in a length direction, of the first portion, and an end, in a length direction, of the second portion. The liquid crystal display device further includes first guide portion that is located at an outer side of the first and second LED packages, and is interposed between and attached to the first and second portions.

In another aspect, an LED assembly includes first and second LED packages that are arranged alternately along a direction. The LED assembly also includes a PCB that has first and second portions which face each other and which the first and second LED packages are mounted at, respectively, and a third portion, in a bent state, which connects an end, in a length direction, of the first portion, and an end, in a length direction, of the second portion. The LED assembly further includes a first guide portion that is located at an outer side of the first and second LED packages, and is interposed between and attached to the first and second portions.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Reference will now be made in detail to exemplary embodiments, examples of which are illustrated in the accompanying drawings. The same reference numbers may be used throughout the drawings to refer to the same or like parts.

Figure 1:
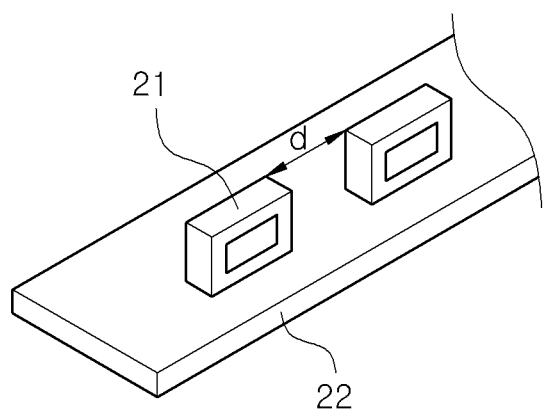
FIG. 1 is a schematic view illustrating an LED assembly for an LED according to the related art.
Figure 2:
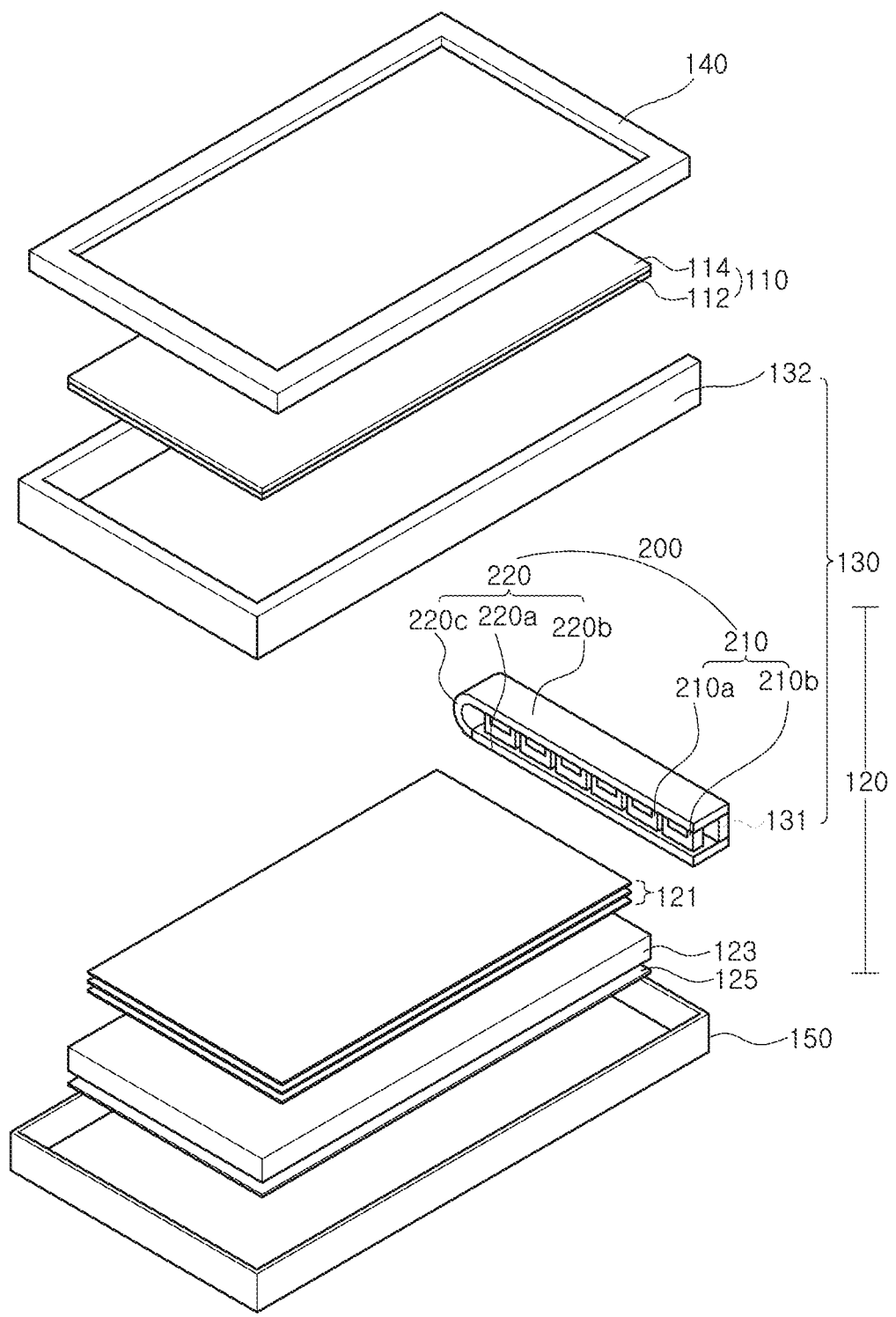
FIG. 2 is a schematic perspective view illustrating an LCD according to an embodiment of the present disclosure.

FIG. 2 is a schematic perspective view illustrating an LCD according to an embodiment of the present disclosure.

Referring to FIG. 2, the LCD 100 of this embodiment includes a liquid crystal panel 110, a backlight unit 120, a guide panel 130, a top case 140 and a bottom cover 150, which are assembled and constitute the LCD 100.

The liquid crystal panel 110 includes first and second substrates 112 and 114 facing and coupled to each other, and a liquid crystal layer between the first and second substrates 112 and 114.

On an inner surface of the first substrate 112 that may be referred to as a lower substrate or an array substrate, gate lines and data lines cross each other to define pixels, and a thin film transistor connected to the corresponding gate and data lines and a pixel electrode connected to the thin film transistor are formed in each pixel (not shown).

On an inner surface of the second substrate 114 that may be referred to as an upper substrate or a color filter substrate, a color filter pattern corresponding to each pixel and a black matrix surrounding the color filter pattern and corresponding to the gate line, the data line and the thin film transistor are formed.

All types of liquid crystal panels may be available as the liquid display panel 110. For example, an IPS type, AH-IPS type, TN type, VA type, or ECB type liquid crystal panel may be used. In case of the IPS type or AH-IPS type, a common electrode to produce an in-plane electric field along with a pixel electrode is formed at the first substrate 112.

Each of the first and second substrates 112 and 114 may include an alignment layer contacting the liquid crystal layer to align liquid crystal molecules. A seal pattern may be formed between peripheries of the first and second substrates 112 and 114.

Further, a polarization plate may be attached to at least one of the first and second substrates 112 and 114.

A printed circuit board may be connected to at least one side of the liquid crystal panel 110 through a flexible circuit film or the like, and may be located below the bottom cover 150 in an assembling process.

The backlight unit 120 is disposed below the liquid crystal panel 110.

The backlight unit 120 includes an LED assembly 200, a reflecting plate 125 having a white or silver color, a light guide plate 123 on the reflecting plate 121, and at least one optical sheet 121 on the light guide plate 123.

The LED assembly 200 includes a plurality of LED packages 210 as light sources facing a light entering surface of the light guide plate 123, and a PCB 220 on which the LED packages 210 that are spaced apart from each other are mounted.

The LED packages 210 may include first LED packages 210a and second LED packages 210b. The first and second LED packages 210a and 210b may be arranged alternately.

The PCB 220 may be a flexible PCB, i.e., FPCB. This PCB 220 may be divided into a first portion 220a, a second portion 220b, and a third portion 220c.

The first portion 220a and the second portion 220b may be arranged to be located at a top portion and a bottom portion, respectively, and face each other.

The first LED packages 210a may be mounted on a surface, i.e., an inner surface, facing the second portion 220b of the first portion 220a, and the second LED packages 210b may be mounted on a surface, i.e., an inner surface, facing the first portion 220a of the second portion 220b.

As such, the first and second portions 220a and 220b may be portions where the respective LED packages 210a and 210b are mounted.

The third portion 220c is located between the first and second portions 220a and 220b and connects the first and second portions 220a and 220b. Otherwise stated, the third portion 220c is configured to connect an end of the first portion 220a and an end of the second portion 220b.

The third portion 220c is a bent portion (or folded portion). By bending (or folding) the third portion 220c, the first and second portions 220a and 220b may be located opposite to each other with the third portion 220c therebetween configured to enable the mounting surfaces thereof to face each other.

As such, the PCB 220 may be divided into the first, third, and second portions 220a, 220c, and 220b arranged along a length direction of the PCB 220. By bending the third portion 220c into a bend portion, the first and second portions 220a and 220b as the mounting portions may be configured to face each other.

When the PCB 220 is in a bent state or folded state by bending the PCB 220 at the third portion 220c, the first LED packages 210a at the first portion 220a and the second LED packages 210b at the second portion 220b are arranged alternately along a length direction of the folded-state PCB 220.

As such, the neighboring LED packages 210 in the folded-state PCB 220 are the first and second LED packages 210a and 210b mounted at the first and second portions 220a and 220b, respectively.

Accordingly, a separation distance limitation between the neighboring LED packages 210 can be substantially minimized, and thus, a limitation on a pitch of the LED packages 210 can be removed.

In this regard, in the related art, since all the LED packages are mounted in the same plane of the PCB, a separation distance between the LED packages is required to be about 600 um or greater in consideration of (1) a mounting tolerance of the LED package, (2) an attaching tolerance of a coverlay film, and (3) an insulating width between the neighboring LED packages.

In contrast, in this embodiment, the first and second LED packages 210a and 210b are mounted at the first and second portions 220a and 220b as portions separated from each other in the PCB 220. Next, the PCB 220 is folded such that the first and second portions 220a and 220b of the PCB 220 face each other. Thus, the first and second LED packages 210a and 210b are located next to each other.

As such, the first and second LED packages 210a and 210b are mounted at the respective mounting surfaces separate and independent from each other in the PCB 220 and are not neighboring packages 210 in the mounting process. Accordingly, a tolerance consideration for a mounting tolerance, an attaching tolerance, and an insulating width is not needed for the first and second LED packages 210a and 210b.

Thus, this embodiment, which employs the first and second LED packages 210a and 210b, does not require a minimum separation distance of 600 nm as required in a traditional manufacturing process of the LED assembly 200.

Rather, the first and second LED packages 210a and 210b can be arranged at a separation distance less than 600 um within a permissible range. Therefore, in this embodiment, a limitation on a pitch of the LED packages 210 can be minimized or removed, and a number of the LED packages 210 available in the LED assembly 200 can be maximized.

Accordingly, since a number of the LED packages 210 increases as needed, an optical distance, which is a distance from the light entering surface of the light guide plate 123 to a display region, can be reduced, and a narrow bezel can be effectively achieved.

Further, in this embodiment, a separation distance between the neighboring first LED packages 210a and a separation distance between the neighboring second LED packages 210b can sufficiently satisfy the minimum separation distance as required in a manufacturing process.

In this regard, in the folded state, the second LED package 210b is located between the neighboring first LED packages 210a, and thus, a separation distance between the first LED packages 210a is secured greater than a width of the second LED package 210b, i.e., the LED package 210. A width of the LED package 210 is, for example, about 1.8 mm to 3.6 mm, which is much greater than the minimum separation distance of 600 um. Thus, regarding the first LED packages 210a, the minimum separation distance can be easily secured. Similarly, regarding the second LED packages 210b, the minimum separation distance can be easily secured.

The light guide plate 123 receives light emitted from the LED packages 210. The light entering the light guide plate 123 travels in the light guide plate 123 by several total reflections to spread uniformly. Thus, the light guide plate 123 supplies the uniform light to the liquid crystal panel 110.

The reflecting plate 125 is located below the light guide plate 123, and functions to reflect light that passes through a bottom surface of the light guide plate 123, toward the liquid crystal panel 110 to increase brightness.

The at least one optical sheet 121 on the light guide plate 123 may include a light diffusion sheet and a light condensing sheet (or prism sheet), and diffuse and condense the light from the light guide plate 123 to supply the light to the liquid crystal panel 110.

The liquid crystal panel 110 and the backlight unit 120 are modulized through the guide panel 130, the bottom cover 150, and the top case 140.

The bottom cover 150 protects and supports a bottom of the backlight unit 120. The bottom cover 150 may include a base portion of a plate shape on which the backlight unit 120 is placed, and side wall portions upwardly bent from edges of the base portion. The backlight unit 120 is accommodated in a space defined by the base portion and the side wall portions.

The top case 140 may have a rectangular frame shape to cover edges of the liquid crystal panel 110.

The guide panel 130 may have a rectangular frame shape to surround side surfaces of the backlight unit 120. The liquid crystal panel 110 may be placed on the guide panel 130, and in this case, the liquid crystal panel 110 may be attached to a top surface of the guide panel 130 using an adhesive member such as a double-sided adhesive tape.

In this embodiment, the guide panel 130 may have a separation structure. For example, the guide panel 130 may include a first guide portion 131 and a second guide portion 132.

The first guide portion 131 may have a structure to be combined with the LED assembly 200 and may be configured to extend along one side surface of the backlight unit 120. The second guide portion 132 may have a '⊏' shape to enclose other surfaces, except for the one side surface, of the backlight unit 120. Otherwise stated, the second guide portion 132 may enclose the other surfaces, where the LED assembly 200 is not located, of the backlight unit 120

Regarding a combination structure of the first guide portion 131 and the LED assembly 200, the first guide portion 131 is interposed between the first and second portions 220a and 220b in a length direction of the first and second portions 220a and 220b, and is attached to the first and second portions 220a and 220b. The first guide portion 131 is located at the back of the LED packages 210, i.e., at a position opposite to the light entering surface of the light guide plate 123.

Since the first guide portion 131 is combined inside the LED assembly 200, the first guide portion 131 can serve to stably maintain and support the bending state of the LED assembly 200.

Since the first guide portion 131 is located at the back of the LED packages 210, the light guide portion 131 can serve to prevent a light leakage to the outside.

Further, the first guide portion 131 can serve as a guide member to fold the PCB 220. In this regard, one end of the first guide portion 131 along a length direction may be arranged to correspond to both ends of the third portion 220c as the bent portion. Both ends of the third portion 220c are a boundary between the third portion 220c and the first portion 220a and a boundary between the third portion 220c and the second portion 220b. Accordingly, when bending the PCB 220, the third portion 220c can be naturally bent around the one end of the first guide portion 131. Thus, the first guide portion 131 can sever to guide the bending position of the PCB 220.

The PCB 220 combined with the first guide portion 131 can serve as a housing that accommodates the LED packages 210 therein and stably supports and protects the LED packages 210.

An adhesive member such as a double-sided adhesive tape may be adhered on a surface of the PCB 220, the first guide portion 131 may be combined with the PCB 220 using the adhesive member. Further, the first LED package 210a mounted at the first portion 220a may be attached to and fixed to the second portion 220b using the adhesive member on the surface of the second portion 220b, and similarly, the second LED package 210b mounted at the second portion 220b may be attached to and fixed to the first portion 220a using the adhesive member on the surface of the first portion 220a.

The LED assembly 200 combined with the first guide portion 131 may be coupled to a component located around the LED assembly 200. For example, the LED assembly 200 may be attached to a top surface of the reflecting plate 125 therebelow using an adhesive member. Similarly, the second guide portion 132 may be attached to a top surface of the reflecting plate 125 therebelow using an adhesive member.

Figure 3:
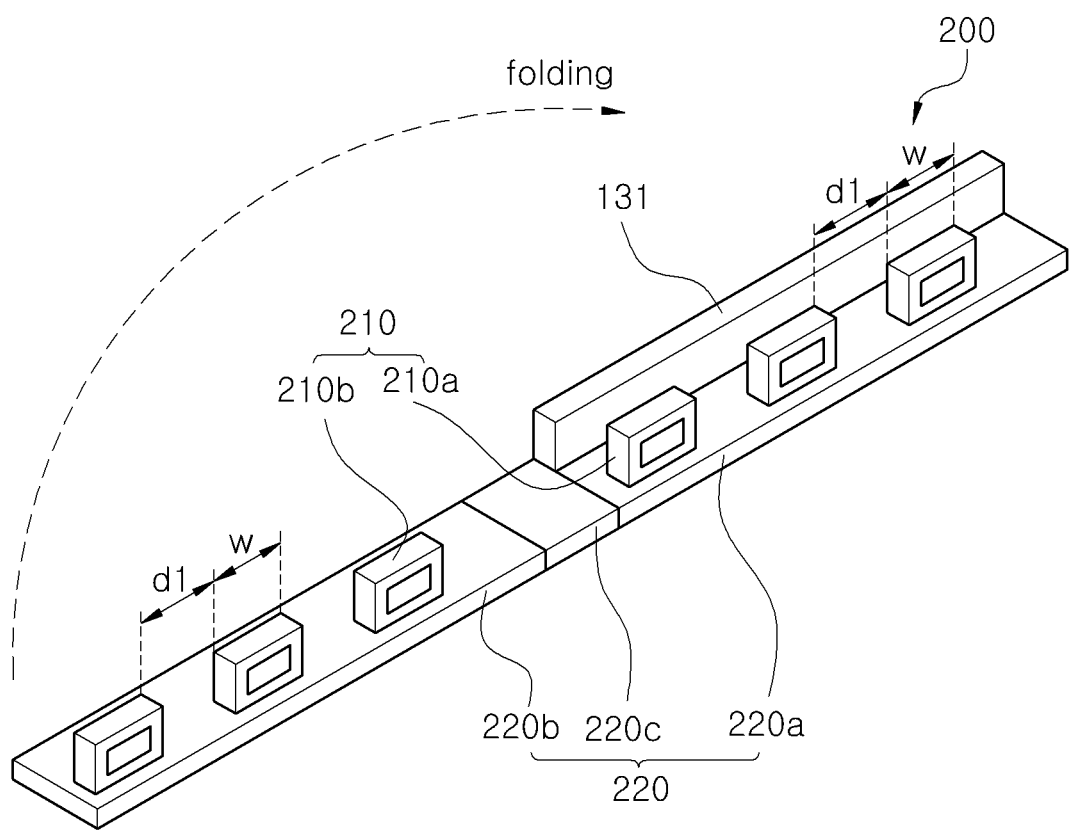
FIG. 3 is a schematic view illustrating a state before folding the PCB of the LED assembly according to the embodiment of the present disclosure.
Figure 4:
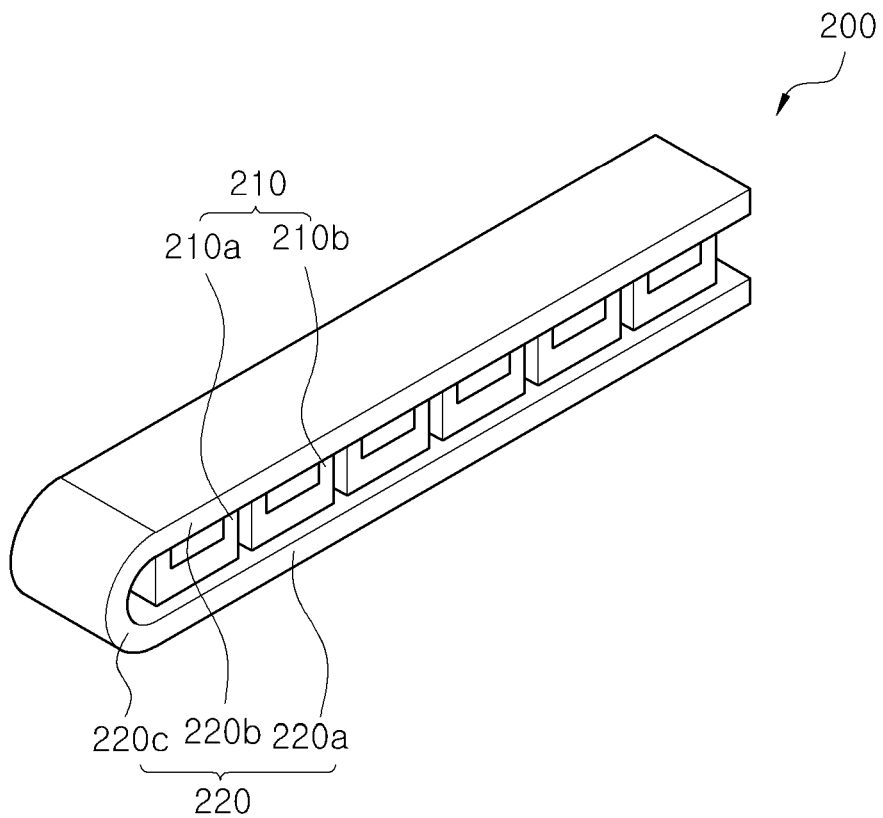
FIG. 4 is a schematic view illustrating a state after folding the PCB of the LED assembly according to the embodiment of the present disclosure.

A manufacturing process of the LED assembly 200 is explained further with reference to FIGS. 3 and 4.

FIG. 3 is a schematic view illustrating a state before folding the PCB of the LED assembly according to the embodiment of the present disclosure. FIG. 4 is a schematic view illustrating a state after folding the PCB of the LED assembly according to the embodiment of the present disclosure.

Referring to FIG. 3, the PCB 220 before the folding has a flat state that the first portion 220a, the third portion 220c and the second portion 220b arranged along an extension direction, i.e., a length direction of the PCB 220 are located substantially in the same plane.

In this flat state, the first and second LED packages 210a and 210b are mounted on the mounting surfaces of the first and second portions 220a and 220b, respectively, using a SMT.

Since a separation distance d1 between the first LED packages 210a at the first portion 220a is greater than a width w of the second LED package 210b that is located between the first LED packages 210a after the folding, the minimum separation distance as required in the manufacturing process can be secured.

Similarly, since a separation distance d1 between the second LED packages 220a at the second portion 220b is greater than a width w of the first LED package 210a that is located between the second LED packages 210b after the folding, the minimum separation distance as required in the manufacturing process can be secured. As such, in this embodiment, the minimum separation distance can be naturally secured.

In the flat state, the first guide portion 131 may be attached on the surface of the first portion 220a or the second portion 220b. In this embodiment, by way of example, the first guide portion 131 is attached on the surface of the first portion 220a.

Then, referring to FIG. 4, a process of folding the PCB 220 that has the LED packages 210 mounted and has the first guide portion 131 attached is conducted. This folding is made by bending the third portion 220c between the first and second portions 220a and 220b.

Since the first guide portion 131 serves as a bending guide member to guide the bending for the third portion 220c (or serves as a folding guide member for the PCB 220), the PCB 220 can be effectively folded around the first guide portion 131.

Adhesive members may be located on the surfaces of the first and second portions 220a and 220b. Accordingly, in the bent state, the first LED packages 210a mounted at the first portion 220a are attached to the second portion 220b using the adhesive member, and the second LED packages 210b mounted at the second portion 220b are attached to the first portion 220b using the adhesive member. Thus, the LED packages 210 are stably fixed to the PCB 220 and the folded state can be stably kept.

Further, the first guide portion 131 is combined with the first and second portions 220a and 220b using adhesive members, and thus the folded state can be further stably kept.

In order to make the bending at the third portion 220c easier, the

PCB 220 may be configured such that a lamination structure of the third portion 220c may be different from a lamination structure of the first and second portions 220a and 220b. This is explained further with reference to FIG. 5 that is a schematic cross-sectional view illustrating an example of a lamination structure of the PCB according to the embodiment of the present disclosure.

Figure 5:
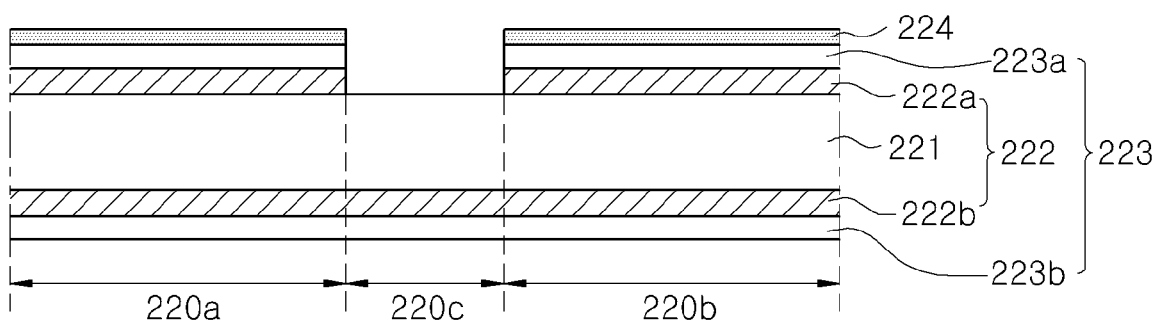
FIG. 5 is a schematic cross-sectional view illustrating an example of a lamination structure of the PCB according to the embodiment of the present disclosure.

Referring to FIG. 5, a base layer 221 is formed entirely over the PCB 220. The base layer 221 may be made of an insulating material, for example, polyimide.

A signal line layer 222 to transfer driving signals to the LED packages 210 may be formed on at least one of both surfaces (i.e., at least one of a top surface and a bottom surface) of the base layer 221. In this regard, at each of the first and second portions 220a and 220b, a first signal line layer 222a and a second signal line layer 222b may be formed on the top surface and the bottom surface of the base layer 221, respectively. At the third portion 220c, the second signal line layer 222b may be formed on one of the top and bottom surfaces, for example, the bottom surface of the base layer 221.

A coverlay film 223 may be formed to cover each signal line layer 222. In this regard, at the first, second, and third portions 220a, 220b, and 220c, a second coverlay film 223b may be formed on the second signal line layer 222b. At the first and second portions 220a and 220b, a first coverlay film 223a may be formed on the first signal line layer 222a. At the third portion 220c, the first coverlay film 223a is not formed. The first coverlay film 223a at the first and second portions 220a and 220b may be formed to expose electrode pads that are portions of the first signal line layer 222a and contact the respective LED packages 210.

An adhesive member 224 may be adhered on the first coverlay film 223a.

As such, the third portion 220c to be bent may be configured to have a number of laminated layers less than a number of laminated layers of the first and second portions 220a and 220b. In other words, compared with the first and second portions 220a and 220b, the signal line layer 222a and the coverlay film 223a may be removed at the third portion 220c, and thus a thickness of the third portion 220c may be reduced. Accordingly, the third portion 220c is more bendable than the first and second portions 220a and 220b, and thus the bending at the third portion 220c can be easily conducted.

All types of LED packages may be used as the LED package 210.

Figure 6:
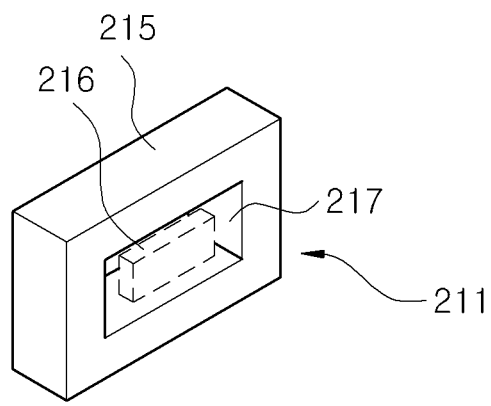
FIGS. 6 to 8 are views illustrating some examples of LED packages used in the LCD according to the embodiment of the present disclosure.
Figure 7:
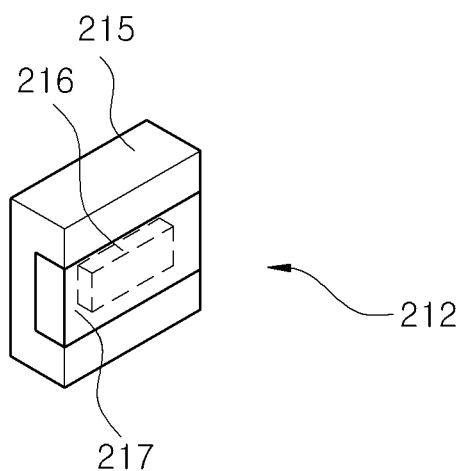
Figure 8:
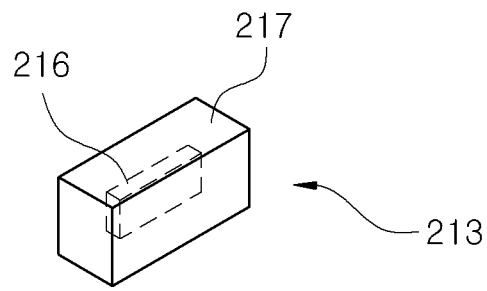

FIGS. 6 to 8 are views illustrating some examples of LED packages used in the LCD according to the embodiment of the present disclosure.

FIG. 6 shows a one-surface emission LED package 211, referred to as a cavity type LED package, that emits a light through, for example, a top surface. In this case, this LED package 211 is arranged such that the top surface as an emission surface faces a light entering surface of a light guide plate. In the LED package 211, an LED chip 216 is located inside a cavity of a mold 215, and a cavity is filled with a fluorescent substance 217.

FIG. 7 shows a three-surface emission LED package 212 that emits a light through a top surface and two side surfaces. This LED package 212 may be manufactured by, for example, removing two side portions, along a width direction of the mold 215 of the LED package 211 in FIG. 6. Thus, two side surfaces of the fluorescent substance 217 may be exposed. Accordingly, a three-surface emission can be achieved. When using the three-surface emission LED package 212, a separation distance between the neighboring LED packages 212 is a separation distance between effective emission regions of the LED packages 212. Thus, compared with the LED packages 211 in FIG. 6, a separation distance between effective emission regions can be reduced, and thus, an optical distance can be further reduced.

FIG. 8 shows a five-surface emission LED package 213, referred to as a chip scale package (CSP), that emits a light through a top surface and four side surfaces. This LED package 213 may be manufactured by, for example, directly coating a top surface and four side surfaces of an LED chip 216 with a fluorescent substance 217. Accordingly, a size of the LED package 213 can be minimized, and thus, the LED package 213 is referred to a chip scale package. Similarly to the three-surface emission LED package 212 in FIG. 7, when using the five-surface emission LED package 213, a separation distance between effective emission regions can be reduced, and thus, an optical distance can be further reduced.

As described above, in this embodiment, the first and second LED packages 210a and 210b are mounted at the first and second portions 220a and 220b separated from each other in the PCB 220. Next, the PCB 220 is folded such that the first and second portions 220a and 220b of the PCB 220 face each other. Thus, the first and second LED packages 210a and 210b are located to neighbor each other. The guide portion 131 is interposed between and attached to the first and second portions 220a and 220b.

The first and second LED packages 210a and 210b neighboring each other can be arranged at less than a minimum separation distance required in the traditional manufacturing process. Thus, a limitation on a pitch of the LED packages 210 can be minimized or removed, and a number of the available LED packages 210 can be maximized. Therefore, an optical distance can be reduced, and a narrow bezel can be effectively achieved. Further, by using the guide portion 131, the folded state of the PCB 220 can be stably maintained.

It will be apparent to those skilled in the art that various modifications and variation can be made in the present disclosure without departing from the spirit or scope of the disclosure. Thus, it is intended that the present disclosure cover the modifications and variations of this disclosure provided they come within the scope of the appended claims and their equivalents.

The various embodiments described above can be combined to provide further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A liquid crystal display device, comprising:
a liquid crystal panel;
a light guide plate below the liquid crystal panel;
first and second LED packages that are arranged alternately along a light entering surface of the light guide plate;
a printed circuit board that includes first and second portions which include inner surfaces facing each other, respectively, the first and second LED packages being mounted on the inner surface of the first portion and the inner surface of the second portion, respectively, the printed circuit board further including a third portion, in a bent state, which connects an end, in a length direction, of the first portion, and an end, in a length direction, of the second portion; and
a first guide portion that is located at an outer side of the first and second LED packages, the first guide portion interposed between and attached to the inner surface of the first portion and the inner surface of the second portion,
wherein the first and second LED packages are between the light guide plate and the first guide portion.

2. The liquid crystal display device of claim 1, wherein the third portion has a number of laminated layers less than a number of laminated layers of each of the first and second portions.

3. The liquid crystal display device of claim 2, wherein each of the first and second portions includes a signal line layer on a surface of a base layer, and a coverlay film covering the signal line layer, while the third portion does not include the signal line layer and the coverlay film.

4. The liquid crystal display device of claim 1, wherein an end, in a length direction, of the first guide portion is located to correspond to the ends of the first and second portions.

5. The liquid crystal display device of claim 1, further comprising a second guide portion enclosing side surfaces, other than the light entering portion, of the light guide plate.

6. The liquid crystal display device of claim 1, wherein an adhesive member is formed at the inner surface of each of the first and second portions,
the first guide portion being attached to the first and second portions using the adhesive members of the first and second portions,
the first LED package being attached to the second portion using the adhesive member of the second portion, and
the second LED package being attached to the first portion using the adhesive member of the first portion.

7. The liquid crystal display device of claim 1, wherein each of the first and second LED packages is a three-surface emission LED package that emits a light through a top surface and two side surfaces, or a five-surface emission LED package that emits a light through a top surface and four side surfaces.

8. The liquid crystal display device of claim 1, wherein the first guide portion contacts the inner surface of the first portion and the inner surface of the second portion.

9. An LED assembly, comprising:
first and second LED packages that are arranged alternately and spaced apart from one another along a length direction of the LED assembly;
a printed circuit board that includes first and second portions which include inner surfaces facing each other, respectively, the first and second LED packages being mounted on the inner surface of the first portion and the inner surface of the second portion, respectively, the printed circuit board further including a third portion, in a bent state, which connects an end of the first portion to an end of the second portion; and
a first guide portion extending along the length direction and facing outer sides of the first and second LED packages, the first guide portion interposed between and attached to the inner surface of the first portion and the inner surface of the second portion.

10. The LED assembly of claim 9, wherein the third portion has a number of laminated layers less than a number of laminated layers of each of the first and second portions.

11. The LED assembly of claim 10, wherein each of the first and second portions includes a signal line layer on a surface of a base layer, and a coverlay film covering the signal line layer, while the third portion does not include the signal line layer and the coverlay film.

12. The LED assembly of claim 9, wherein an end, in a length direction, of the first guide portion is located to correspond to the ends of the first and second portions.

13. The LED assembly of claim 9, further comprising:
a light guide plate, the first and second LED packages positioned between the light guide plate and the first guide portion; and
a second guide portion enclosing side surfaces, other than a light entering portion, of the light guide plate.

14. The LED assembly of claim 9, wherein an adhesive member is formed at the inner surface of each of the first and second portions,
the first guide portion being attached to the first and second portions using the adhesive members of the first and second portions,
the first LED package being attached to the second portion using the adhesive member of the second portion, and
the second LED package being attached to the first portion using the adhesive member of the first portion.

15. The LED assembly of claim 9, wherein each of the first and second LED packages is a three-surface emission LED package that emits a light through a top surface and two side surfaces, or a five-surface emission LED package that emits a light through a top surface and four side surfaces.

16. The LED assembly of claim 9, wherein the first guide portion contacts the inner surface of the first portion and the inner surface of the second portion.

17. A light emitting diode assembly, comprising:
first and second light emitting diode packages, the first light emitting diode package arranged alternately to the second light emitting diode package along a direction;
a printed circuit board that includes first and second portions which include inner surfaces facing each other, respectively, the first and second light emitting diode packages being mounted on the inner surface of the first portion and the inner surface of the second portion, respectively, the first and second light emitting diode packages being mounted between opposite first and second ends of the first portion,
the printed circuit board further including a bent portion that connects the first end of the first portion to an end of the second portion; and
a first guide portion extending from the first end to the second end of the first portion of the printed circuit board, the first guide portion located at an outer side of the first and second light emitting diode packages, the first guide portion interposed between and attached to the inner surface of the first portion and the inner surface of the second portion.

18. The light emitting diode assembly of claim 17, wherein the third portion has a number of laminated layers less than a number of laminated layers of each of the first and second portions.

19. The light emitting diode assembly of claim 18, wherein each of the first and second portions includes a signal line layer on a surface of a base layer, and a coverlay film covering the signal line layer, while the third portion does not include the signal line layer and the coverlay film.

20. The light emitting diode assembly of claim 17, wherein an end of the first guide portion is located to correspond to the ends of the first and second portions.

21. The light emitting diode assembly of claim 17, further comprising:
a light guide plate, the first and second light emitting diode packages positioned between the light guide plate and the first guide portion, and
a second guide portion enclosing side surfaces of the light guide plate other than a light entering portion.

22. The light emitting diode assembly of claim 17, wherein an adhesive member is formed at the inner surface of each of the first and second portions,
the first guide portion being attached to the first and second portions using the adhesive members of the first and second portions,
the first light emitting diode package being attached to the second portion using the adhesive member of the second portion, and
the second light emitting diode package being attached to the first portion using the adhesive member of the first portion.

23. The light emitting diode assembly of claim 17, wherein the first guide portion contacts the inner surface of the first portion and the inner surface of the second portion.

* * * * *